(12) United States Patent
Couteau et al.

(10) Patent No.: US 6,326,313 B1
(45) Date of Patent: Dec. 4, 2001

(54) METHOD AND APPARATUS FOR PARTIAL DRAIN DURING A NITRIDE STRIP PROCESS STEP

(75) Inventors: Terri A. Couteau, Rosanky; Stacie Y. Brown, Paige, both of TX (US)

(73) Assignee: Advanced Micro Devices, Sunnyvale, CA (US)

( * ) Notice: Subject to any disclaimer, the term of this patent is extended or adjusted under 35 U.S.C. 154(b) by 0 days.

(21) Appl. No.: 09/295,941

(22) Filed: Apr. 21, 1999

(51) Int. Cl.$^7$ .................... H01L 21/302; H01L 21/461
(52) U.S. Cl. ................... 438/745; 438/749; 438/757
(58) Field of Search ................... 438/743, 747, 438/745, 749, 757, 748, 750, 756; 156/345; 216/90, 93, 86

(56) References Cited

U.S. PATENT DOCUMENTS

| | | | |
|---|---|---|---|
| 4,710,261 | * 12/1987 | Dennis | 156/626 |
| 5,470,421 | * 11/1995 | Nakada et al. | 156/642.1 |
| 5,607,543 | * 3/1997 | Eisenberg et al. | 156/662.1 |
| 5,820,689 | * 10/1998 | Tseng et al. | 134/3 |
| 5,843,850 | * 12/1998 | Shin et al. | 438/757 |
| 6,045,621 | * 4/2000 | Puri et al. | 134/2 |

* cited by examiner

Primary Examiner—Robert Kunemund
Assistant Examiner—Duy-Vu Deo
(74) Attorney, Agent, or Firm—James A. Harrison; Bruce Garlick

(57) ABSTRACT

A method of performing a nitride strip process step for a plurality of semiconductor wafers includes partially draining the chemical solution within a chemical bath after every nitride strip in which the oxide etch rate is within a specified range. If the oxide etch rate is above the specified range, the partial drain is performed. Once the etch rate falls within the range, the partial drain is performed every time a bath increment signal is received. If the etch rate falls below the specified range, then the bath is completely drained so that the solution may be replaced with fresh chemicals. While it is generally desirable to minimize the amount of field oxide that is removed during the nitride strip process step, the field oxide etch should be maintained at a specified level because, when below that level, the chemical solution silicon content is too high risking the possibility that the silicon will precipitate and cause undesirable effects including coating the wafers being stripped of nitride. The partial drain time is adjusted from a nominal rate according to measured oxide etch rates. For a first bath in a sequential series of baths, the nominal partial drain time is fifteen seconds. For a second bath in the sequential series of baths, the nominal rate is ten seconds.

18 Claims, 5 Drawing Sheets

METHOD AND APPARATUS FOR PARTIAL DRAIN DURING A NITRIDE STRIP PROCESS STEP

BACKGROUND

1. Field of the Invention

The present invention relates generally to integrated circuit manufacture; and more particularly to an apparatus and a method of manufacture for performing a nitride strip process step.

2. Description of the Related Art

The structure and the various components, or features, of a metal oxide semiconductor (MOS) devices are generally well known. A MOS transistor typically includes a substrate material onto which a gate dielectric and a patterned gate conductor are formed. The gate conductors' impurities that are forwarded into the substrate are self-aligned on opposite sides of the gate conductor. The impurities placed into the substrate define a junction region, also known as source and drain regions. The gate conductor typically is patterned from a layer of polysilicon using various lithography techniques.

A typical n-channel MOS transistor employs N-type junctions placed into a P-type substrate. Conversely, a typical p-channel MOS transistor comprises P-type junctions placed into an N-type substrate. The substrate comprises an entire monolithic silicon wafer.

A pocket or well of oppositely doped substrate often exists within part of the substrate. The well is doped opposite the substrate so that it can accommodate junctions of an impurity type opposite the junctions formed in the remaining areas of the substrate. Accordingly, wells are often employed when both N-type and P-type transistors (i.e., Complementary MOS, "CMOS") are needed.

A common trend in modern integrated circuit manufacture is to produce transistors having feature sizes as small as possible. To achieve a high density integrated circuit, features such as the gate conductors, source and drain junctions, and interconnects to the junctions must be made as small as possible. Many modern day processes employ features that have critical dimensions that are as small as 0.20 microns.

As feature sizes decrease, the sizes of the resulting transistors and the interconnections between transistors also decrease. Having smaller transistors allows more transistors to be placed on a single monolithic substrate. Accordingly, relatively large circuits can be incorporated on a single and relatively small die area.

Further, smaller transistors typically have lower turn-on threshold voltages, faster switching speeds and consume less power in their operation. These features, in combination, allow for higher speed integrated circuits to be constructed that have greater processing capabilities and that produce less heat.

The benefits of high-density circuits can only be realized if advanced processing techniques are used. For example, semiconductor process engineers and researchers often study the benefits of electron beam lithography and x-ray lithography to achieve the higher resolutions needed for submicron features. To some extent, wet etch has given way to a more advanced anisotropic (dry etch) technique. Further, silicides and polycides have replaced higher resistivity contact structures mostly due to the lower resistivity needed when a smaller contact area is encountered.

Many other techniques are often used to achieve a higher density circuit. However, these techniques must contend with problems resulting from higher density itself. Even the most advanced processing techniques cannot, in all instances, offset the problems associated with small features or features arranged extremely close to one another.

For example, as the channel length decreases, short channel effects ("SCE") generally occur. SCE cause threshold voltage skews at the channel edges and also excessive sub threshold currents (e.g., punch through and drain-induced barrier lowering). Related to SCE is the problem of hot carrier injection ("HCI"). As the channel shortens and the supply voltage remains constant, the electric field across the drain-to-channel junction becomes excessive.

Excessive electric fields produce so called hot carriers and the injection of these carriers into the gate oxide that resides between the substrate (or well) and the overlying gate conductor. Injection of hot carriers should be avoided since these carriers can become trapped and skew the turn-on threshold voltage of the resulting transistor. In view of these considerations, certain scaling limits are being reached.

Metal Oxide Semiconductor (MOS) transistors are typically formed in an isolated active device region of a semiconductor substrate. These active device regions are separated by field oxide regions formed of silicon dioxide and are known as isolation regions. Interconnects are used to electrically couple the MOS transistors to other devices on the semiconductor substrate.

An interconnect that overlies a field oxide between device active areas may inappropriately function as a gate electrode of a parasitic MOS transistor formed between diffused regions of two adjacent MOS devices. The parasitic transistors thus cause leakage current to flow between the adjacent devices resulting in increased power consumption and, sometimes, in device failure.

To reduce or eliminate the inadvertent operation of parasitic transistors, it is a common technique to increase the threshold turn-on voltage of the parasitic transistors to keep them from operating. Usually, increasing the threshold turn on voltage prevents the operation of the parasitic device and, therefore, eliminates the undesirable current flow.

One approach for increasing the threshold turn-on current is to thicken the field oxide. Another approach is to increase the doping beneath the field oxide. Typically, ion implantation is used to create what is known as channel-stop implants. The combination of thicker oxide and channel-stop implants usually provide adequate isolation. As may be seen, therefore, a certain thickness of the field oxide must be maintained to prevent leakage currents caused by parasitic devices.

After a field oxidation process step in which the isolation (field oxide) regions are created, a masking layer (often a nitride layer) must be stripped or removed. As a result of processing techniques, however, even the nitride strip itself often includes an outer layer of silicon dioxide and/or oxynitride. Some common processing steps chemically alter the outer layer of the nitride to convert it to silicon dioxide or oxinitride. In other common processing techniques, a layer of oxide is formed on top of the nitride during processing steps to form the field oxides. The problem can be even more challenging when the nitride to be removed is a patterned nitride layer having some oxide on its outer surface.

Accordingly, a typical wet etch nitride strip process step includes removing the silicon dioxide and/or oxynitride plus the nitride itself. Because silicon dioxide and nitride are selective, either two process steps must be used (one for the oxide and one for the nitride) or a process step must be performed that is adapted to remove both the oxide layer and the nitride layer. A combined process step to remove the nitride and the oxide is often preferred for many reasons including efficiency.

One problem, however, of removing the oxide and the nitride in a combined step is that the field oxide may also be excessively removed thereby lowering the threshold turn-on voltages of the parasitic devices. On the other hand, if too little oxide is removed, the chemicals that are selective to the nitride may not remove enough of the nitride layer thereby resulting in a potentially ruined wafer.

Accordingly, having a wet etch chemical composition that is sufficiently strong to remove the outer oxide layer is very important. This outer oxide layer must also be removed, however, in a time that is quick enough to allow the nitride to be stripped completely within the specified period for the strip process. On the other hand, it cannot be so strong that excessive amounts of the field oxide are removed.

Field oxide losses from wet etch chemical processes are often a serious concern and a difficult problem to solve because the byproducts of the nitride strip affect the oxide etch rate. More specifically, the oxide etch rate in a hot phosphoric bath decreases as the silicon content of the phosphoric acid solution increases. The reason for this is that the nitride etch reaction produces dissolved silicon dioxide that, in turn, reduces the effectiveness of the wet etch chemicals that are selective to the oxide.

The increased amounts of silicon in the phosphoric solution are beneficial in that they reduce the oxide etch rate thereby advantageously resulting in thicker field oxides. Too much silicon, however, can be too much of a good thing. Excessive amounts of silicon can result in the silicon precipitating, ie., chemically coming out of the solution to form on the wafer and other undesirable places.

In other situations, for instance, in those situations where the nitride is completely covered by an oxide layer, the wet etch chemicals that are selective to the nitride and do not begin to remove the nitride until the outer layer of oxide is removed. Accordingly, a slow oxide etch reduces how much time the chemicals selective to the nitride have to do the nitride strip and can result in an ineffective nitride strip process step.

To solve these problems, the solution in wet etch chemical baths are periodically drained and replaced with fresh phosphoric acid. Typically, a chemical bath is drained once per day to insure that dissolved silicon levels stay below a specified threshold. For example, a chemical bath is often drained after a specified number of wafers have been processed in a nitride strip process step.

One problem with draining the chemical bath, however, is that it takes nearly eight hours to prepare it to continue doing nitride strip process steps.

Preparing the bath includes draining it, refilling it and bringing it up to temperature. Additionally, the bath must be seasoned to keep the phosphoric from being too strong (and from etching too much of the field oxide) Finally, the chemical bath must be recertified before being used to strip nitride.

Another problem that results from common bath drain procedures is that the oxide etch rate changes significantly between changes of solution. For example, a fresh bath may have an oxide etch rate that is approximately equal to 3.6 Angstroms per minute. After one thousand wafers, however, a typical etch rate is about 0.6 Angstroms per minute.

The differences in etch rates therefore results in the batches of wafers having field oxide layers having different thickness. As explained before, these different thicknesses result in the parasitic device threshold turn-on voltages being different from wafer lot to wafer lot.

A method and an apparatus that allow the oxide etch rates to be kept at a more constant level to allow greater device consistency, therefore, is greatly needed.

There also is a need, generally, to increase bath throughput capacity and to decrease the amount of wet etch chemicals consumed during the nitride strip process steps.

SUMMARY OF THE INVENTION

The problems outlined above are in large part solved by a nitride strip process in which the solution in a chemical bath is partially drained after every wafer lot is processed therein. A wafer lot is a cassette of wafers that holds between one and twenty-five wafers. Current systems can typically handle either one or two wafer lots in one bath at a time. For simplicity, reference to a wafer lot includes either one or two lots of wafers.

A specially adapted chemical bath controller is modified to allow an individual to specify an amount of time that the chemical bath is to be partially drained. The chemical bath controller also is adapted to communicate with a valve controller to indicate the amount of drain time selected by the operator. The valve controller also is adapted to partially drain the bath for the specified period whenever the bath controller indicates that a wafer lot has been removed and that a wafer nitride strip is complete.

Responsive to the indication from the bath controller than a prior nitride strip process step is complete, logic circuitry prompts the valve controller to generate control signals to cause a valve open and to drain the bath. The controller causes the valve to stay open for the specified period.

Typically, the specified amount of time is in the range of tens of seconds as compared with the hundreds of seconds required to drain the bath completely. Existing equipment then operates to fill the chemical bath with fresh chemical solution until a specified volume or amount of bath fluid is present in the bath. The inventive process, including using a partial drain process step after every bath (nitride strip process step) provides greater consistency in field oxide thickness, improves throughput and lowers chemical costs.

In one embodiment of the inventive method, the controller opens the valve for a first bath in a series of chemical baths for a period that is approximately fifteen seconds. Either the same or a different controller (according to system implementation) then opens a valve for a second bath to drain it for a period that is approximately two-thirds the period for the first bath. In both cases, pre-existing equipment is operable to refill the baths to specified fluid levels. Typically, a wafer lot is stripped in the first bath for a defined period and then in a second bath for half the defined period.

While a typical (nominal) drain time for the first bath is fifteen seconds and for the second bath is ten seconds as a default, these times may be varied by an operator. For example, if a measured difference in oxide thickness of a given wafer before and after a bath is less than a specified amount, the bath times of each bath may be increased by two seconds for the first bath and one second for the second bath, by way of example, to cause a greater amount of bath solution (and more significantly, silicon therein) to be drained and replaced with fresh chemicals. In general the partial drain time for the first bath is in the range of zero to twenty five seconds. The partial drain time for the second bath is in the range of zero to twenty seconds. Ordinarily, however, the ratio of the partial drain times for the first and second baths is a 2:1 ratio. One practicing the teachings of the invention, however, may readily modify the ratios according to specific design requirements. For the described processes for stripping nitride, a hot phosphoric solution is used for stripping the nitride and oxide.

Alternatively, if the measured change in field oxide thickness is greater than a specified or desired amount, the partial drain time of the bath may be altered to reduce the etch rate. Reducing the partial drain time serves to keep a greater amount of silicon in the bath. Once a steady state is reached, meaning, once the desired etch rate is reached, the drain rates are used to maintain the desired etch rate by maintaining a desired silicon content in the solution of the chemical bath.

A modified logic device according to the present invention also is operable to cause a valve for a chemical bath to be opened for a specified amount of time to achieve a complete drain if required for maintenance or for other reasons.

The modified valve controller logic device also is operable to receive signals specifying an operator selected partial drain time. Responsive to the operator selected partial drain time, the valve controller is operable to cause the valve to only be open for a much smaller period thereby resulting in only a partial drain. In one embodiment, the logic device is operable to detect a switch position that represents a desired amount of time that the valve is to be left open for the partial drain. In the preferred embodiment, the logic device is operable to receive a signal from the controller in which the received signal represents a desired amount of time that the valve is to be left open for the partial drain.

An inventive method generally includes the steps of determining an oxide etch rate on a periodic basis and adjusting the partial drain time of the chemical bath for subsequent baths from a nominal or default value. Adjusting the partial drain time serves to change the silicon content of the bath solution to either increase or decrease the etch rate by causing less or more silicon, respectively, to be drained and replaced with fresh chemicals.

BRIEF DESCRIPTION OF THE DRAWINGS

A better understanding of the present invention can be obtained when the following detailed description of the described embodiments is considered with the following drawings, in which.

DETAILED DESCRIPTION OF THE DRAWINGS

Figure 1:
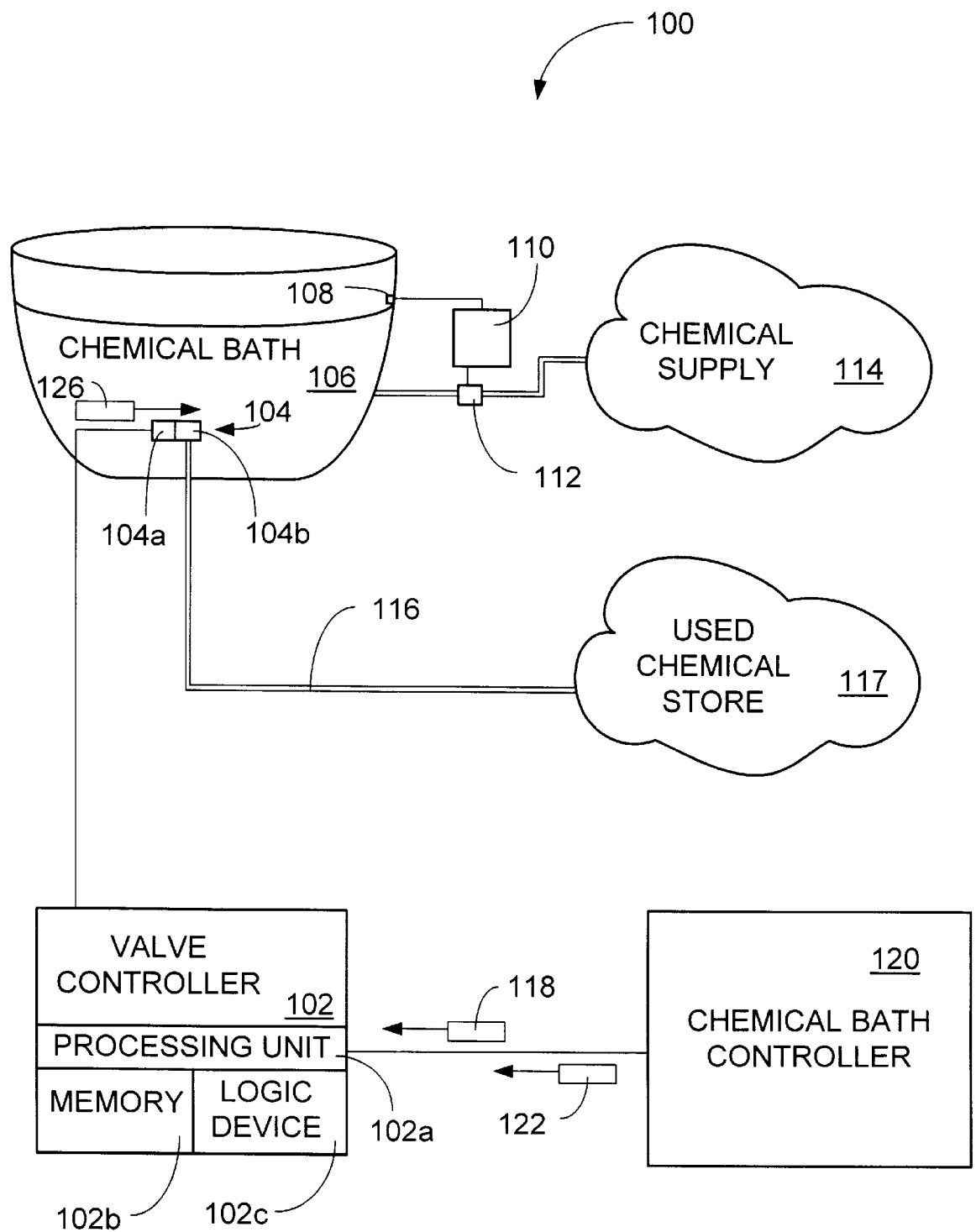
FIG. 1 is a functional block diagram illustrating a chemical bath system for performing a nitride strip according to a preferred embodiment of the invention.

FIG. 1 is a functional block diagram illustrating a chemical bath system for performing a nitride strip according to a preferred embodiment of the invention. Referring now to FIG. 1, a nitride strip etch system 100 includes a valve controller 102 that is electrically connected to a valve 104 of a chemical bath 106. The valve 104 of chemical bath 106 is for draining the fluids within the bath responsive to control signals received from a controller. Valve 104 includes a pump 104a and a valve 104b to conduct solution from the chemical bath 106. In the described embodiment, the pump causes the solution to be drained from the chemical bath 106 at a rate of approximately 0.16 liters/second.

One embodiment of valve 104 includes a switch that is operable to apply power to an electrically operated valve and to the pump as long as a select signal is received by the switch. All types of valves and valve systems that may be controlled by a logic device, a computer or a programmable logic controller, however, are included herein for the purposes of this invention.

Chemical bath 106 further includes a level sensor 108 connected to a controller 110 that operates a valve system 112 that, when open, supplies fresh chemicals from a fresh chemical supply 114 into the chemical bath 106. In the described embodiment, chemical bath 106 includes an inner and an outer bath portion that are fluidly coupled. The valve 104 is fluidly connected to drain chemical solution from the inner bath. The level sensor 108 is placed to detect fluid levels in the outer bath portion of chemical bath 106. Valve 104 also is mechanically connected to a conduit 116 for draining used chemical solution to a used chemical container 117.

Continuing to refer to FIG. 1, valve controller 102 also is connected to receive a partial drain time signal 118 from a bath controller 120. In the described embodiments, the partial drain times are selectable in one second increments.

In the described embodiment, bath controller 120 is a logic device that is operable to transmit a control signal that reflects an operator selected partial drain time. A software "switch" is used to prompt an operator to enter a new value for a partial drain time. In an alternate embodiment, bath controller 120 includes a hardwired switch that provides a voltage on a specified line according to a switch position selected by an operator.

The "switch" for selecting partial drain times, therefore, may be either a part of a bath controller 120 or it may be any other common type of switch including hardwired switches. Software switches, as used herein the described embodiment, in which an operator provides a numerical selection responsive to a program query are used to specify the partial drain time or the adjustment to the initially programmed partial drain time.

In operation, valve controller 102 includes a processing unit 102a that receives the partial drain time signal 118 from the bath controller 120 and stores a corresponding drain time in a store 102b formed within the valve controller 102. Logic circuitry 102c within valve controller 102 is operable to provide the operating logic for processing by a processing unit 102a.

Processing unit 102a also is coupled to receive a bath increment signal 122 from bath controller 120. Bath controller 120 transmits the bath increment signal 122 after each batch cycle is complete as indicated by a robotic action to remove a wafer lot.

Upon receiving the bath increment signal 122, processing unit 102a communicates with logic circuit 102c to transmit a valve control signal 126 to the valve 104 to cause the valve to open. After a specified period, processing unit 102a transmits the valve control signal 126 to cause the valve 104 to close. The specified period is approximately the same as the period represented within the partial drain time signal 118 that was last received by the processing unit 102a from the bath controller 120. In an alternate embodiment, processing unit 102a merely holds a voltage level on the line connecting the valve controller 102 to the valve 104 to a specified logic state (voltage level) until the valve 104 is to be closed. Here, the valve stays open only while a specified voltage level is being received as valve control signal 126.

Figure 2:
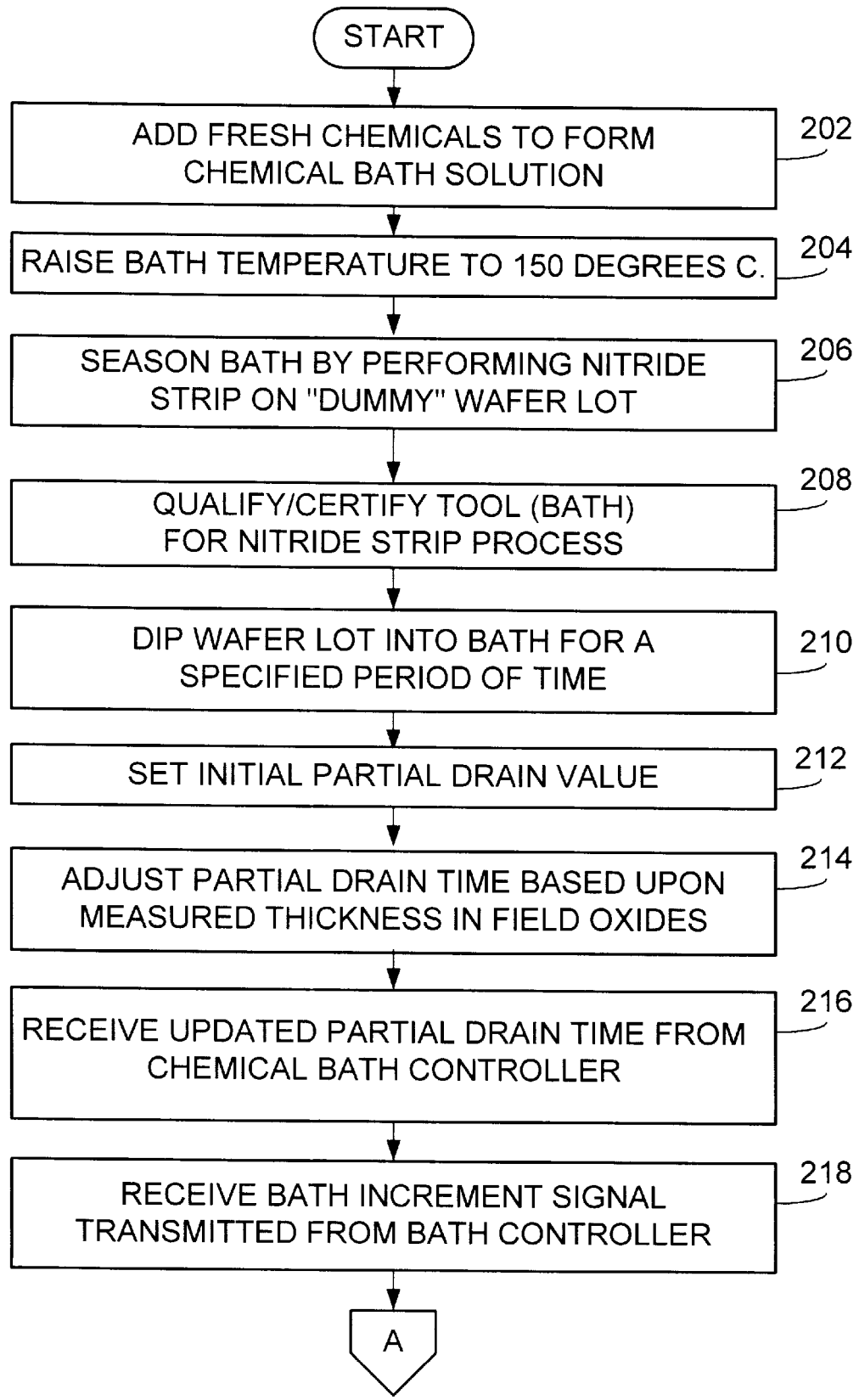
FIG. 2 is a logic flow diagram illustrating a method for operating a chemical bath for nitride strip processes.

FIG. 2 is a logic flow diagram illustrating a method for operating a chemical bath for nitride strip processes. Referring now to FIG. 2, the chemical bath 106 of FIG. 1 is filled with fresh chemicals to form a solution within the bath 106 (step 202). In the preferred embodiment of the invention, the fresh chemicals include phosphoric acid that is selective to the oxide. The bath solution also includes chemicals that are selective to the nitride to strip the nitride from the semiconductor wafers that are to be dipped within the bath 106. In the described embodiment, the phosphoric catalyzes the silicon nitride reaction with water to strip the nitride and to produce silicon dioxide as a byproduct. The chemicals are received by the chemical bath 106 from a chemical supply 114 of FIG. 1. A controller 110 is operable to open a valve system 112 and to cause a pump to conduct fresh chemicals into the chemical bath and to close the valve system 112 whenever a specified signal is received.

After the bath 106 is filled to a specified level (as determined and controlled by a chemical supply system having a fluid sensor), the temperature is increased to a select temperature (step 204). In the described embodiment, the select temperature is 150 degrees Celsius. After the bath temperature reaches the select temperature, the phosphoric acid may be too strong for the nitride strip process and may etch too much oxide. Accordingly, the bath 106 is seasoned by allowing it to etch a dummy lot of nitride wafers (step 206). Each time a nitride strip is performed, the silicon content is increased in the chemical solution of bath 106 as a byproduct of the nitride strip process step. The increased silicon solution serves to reduce the oxide etch rate.

After the dummy lot of wafers are etched to increase the silicon content in the bath 106 solution to reduce the oxide etch rate, the bath 106 is qualified for operation (step 208). Once the bath 106 is seasoned and qualified to perform a nitride strip, a wafer lot is dipped into the bath for a specified amount of time to strip the nitride layer thereon (step 210). A typical value for the specified amount of time for the nitride strip is between thirty and forty minutes.

An initial partial drain value is set for draining the chemical bath 106 after processing the first wafer lot (step 212). In the described embodiment, the initial partial drain time is set to fifteen seconds for a first bath and ten seconds for a second bath.

In trial experiments conducted by the inventors herein, it has been found that an approximate partial drain times of fifteen seconds for a first chemical bath and ten seconds for a second chemical bath are optimal for maintaining the desired silicon content (and corresponding etch rate) in the first and second bath solutions, respectively.

To adjust partial drain times, and once the wafer lot is removed from the bath 106, the oxide thickness is measured to figure out the change in oxide thickness and the corresponding approximate etch rate. Typically, a laser-based measurement tool is used to measure the chance in oxide thickness. Upon determining how much oxide was removed in the etch step, an etch rate is determined and the drain time for the partial drain is adjusted accordingly (step 214). By way of example, if the amount of etched oxide is lower than wanted by a small amount, for example, 600 Angstroms instead of a desired 900 Angstroms, the partial drain bath time might be increased from fifteen seconds to seventeen seconds for a first bath and from ten seconds to twelve seconds for a second bath. While the exact correlation between how much oxide etched, or etch rate, and the concentration in silicon is not known exactly, it is known that setting the partial drain time to fifteen seconds and ten seconds for the first and second baths, respectively, is effective for maintaining a desired etch rate while preventing silicon precipitation. The nitride etch rate is unaffected by the silicon levels in the solution of bath 106.

Afterwards, valve controller 102 receives an updated partial drain time signal 118 from the bath controller 120 of FIG. 1 (step 216). The updated partial drain time is manually adjusted by an operator with the goal maintaining a constant amount of silicon in the bath solution. It is understood, of course, that silicon content cannot stay constant because it changes during the nitride strip process. Ideally, however, how much silicon is removed once the etch rate is at a desired level will equal how much silicon is created during a nitride strip.

Some time after a wafer lot hag been removed from the bath, processing unit 102a of valve controller 102 receives a bath increment signal 122 transmitted from a bath controller 120 (step 218). This bath increment signal 122 is used in the described embodiment to trigger valve controller 102 to begin the partial drain.

Figure 3:
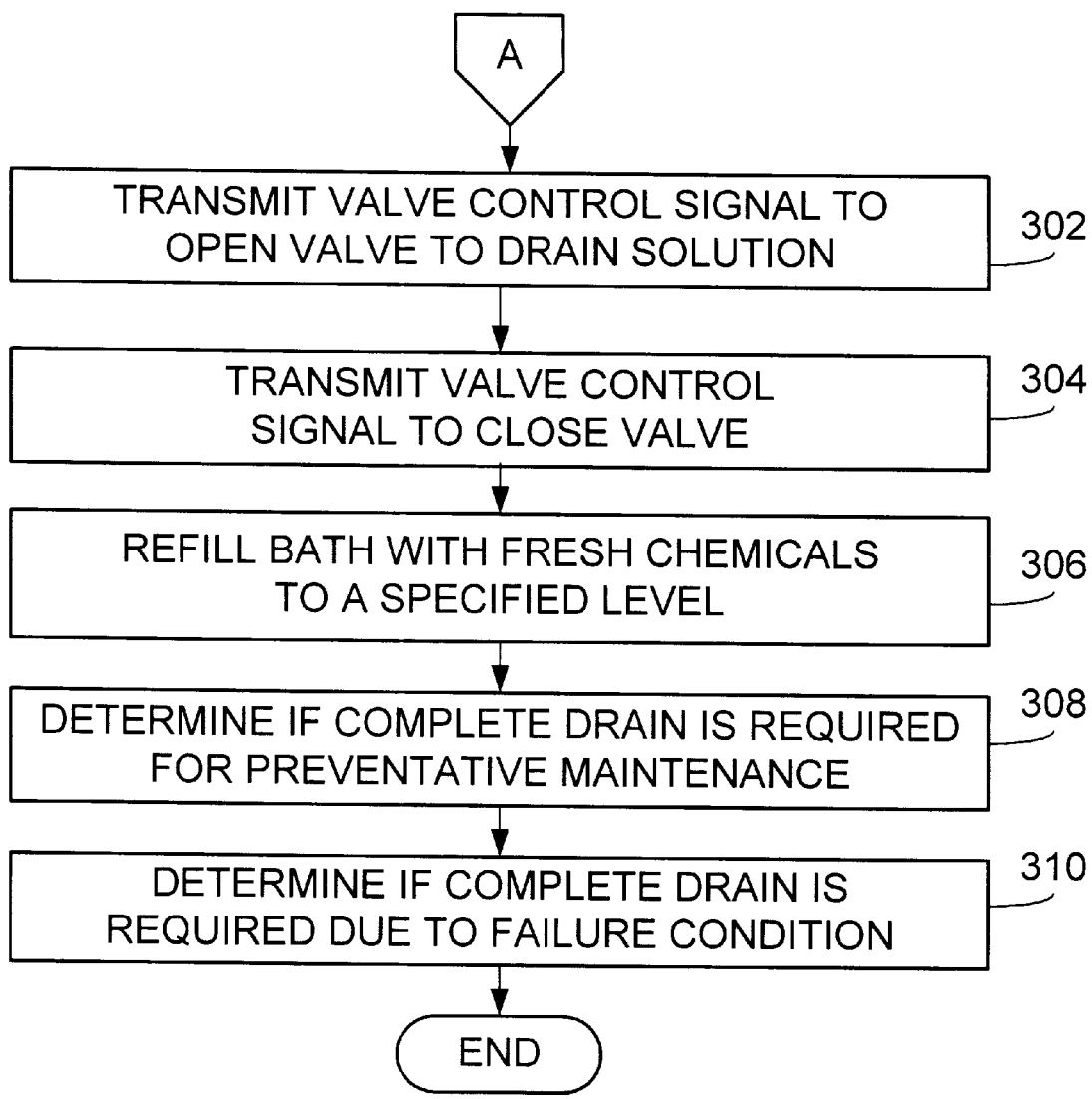
FIG. 3 is a logic flow diagram that illustrates a continuation of the method illustrated in FIG. 2 for etching a wafer lot to perform a nitride strip therefor according to a preferred embodiment of the inventive method.

FIG. 3 is a logic flow diagram that illustrates a continuation of the method illustrated in FIG. 2 for etching a wafer lot to perform a nitride strip therefor according to a preferred embodiment of the inventive method. After receiving the bath increment signal 122, processing unit 102a transmits a valve control signal 126 to valve 104 to cause valve 104 to open and to drain chemical bath 106 for the most recently specified drain time (step 302). The valve control signal 126 can be either a digital signal, a voltage pulse, or a TTL voltage level that serves to keep the valve open while the voltage is being impressed upon the line by the valve controller 102.

Once the valve has been open for the specified amount of time, valve controller 102a transmits a valve control signal 126 to cause the valve 104 to close (step 304). The chemical bath then is refilled with fresh chemicals until a specified level is obtained as determined by the fluid level sensor 108 of chemical bath 106 (step 306). More specifically, when fluid level sensor 108 senses fluid, it communicates with controller 110 to prompt controller 110 to close valve system 112 to prevent additional fresh chemicals from being delivered to chemical bath 106. In the described embodiment, the chemical added to bath 106 is phosphoric.

As is known by those skilled in the art, and as already mentioned, a chemical bath 106 of FIG. 1 actually includes an inner bath and an outer bath that are fluidly coupled. The level sensor 108 senses the level of the solution in the outer bath. The solution is drained from the inner bath, however. Accordingly, after a partial drain as described above is performed, it may take up to 120 seconds in the described systems for the level sensor 108 to detect the drop in fluid level. Accordingly, there is up to a two minute delay before controller 110 of FIG. 1 opens valve system 112 to allow additional chemicals to be conducted into chemical bath 106 to replace the drained solution.

After the chemical solution is replaced, the bath solution must be brought back up to temperature (150 Degrees Celsius in the described embodiment). In the described embodiments, wherein two baths are used to strip nitride from wafer lots, the first chemical bath 106 typically requires between twenty and twenty five minutes and the second chemical bath 106 typically requires between ten and twenty minutes to be brought back to temperature. As may be seen, the ratio of time to bring the baths back to temperature typically is equal to the ratio of the partial drain times for each bath. When the level sensors of the chemical bath are properly calibrated, the ratio more closely equals the ratio of the drain times.

Once a chemical bath has been used a specified number of times or for a specified period of time, or when a specified condition occurs (eg., a specified failure rate in processed wafers or components therein), the bath is drained completely instead of partially. Therefore, the inventive method includes determining whether a specified number of times or a specified period of time has elapsed since the last complete drain (step 308). Additionally, the invention includes continuously determining whether a specified condition has occurred which requires a complete drain and re-certification of the chemical bath 106 (step 310). Once the chemical bath 106 has been drained, the process continues as described above in step 202.

A complete drain is performed, in the described embodiment, periodically for preventive maintenance. More specifically, the solution in the chemical bath is completely drained every ten days. Other cyclical periods may also be chosen. For example, a complete drain may also be done every two weeks or even weekly.

Besides draining the solution of the chemical bath periodically for preventive maintenance, it also is drained upon the occurrence of a specified fault condition. In the described embodiment, the solution in the bath also is drained whenever the nitride etch rate falls below a specified limit causing the tool to be out of compliance wish performance specifications. For example, if the nitride etch rate falls below a given amount, the tool itself may be malfunctioning and the bath may require draining as a part of investigating the problem. For example, if the nitride is being etched at a rate that is below the target of 30 Angstroms per minute, the chemical bath 106 is completely drained. Alternatively, if the nitride etch rate is above 36 Angstroms per minute, the tool is checked for problems and a complete drain may be required. Similarly, if the field oxide etch rate falls below a specified limit, for example, 0.4 Angstroms per minute, the bath solution is completely drained.

Finally, the chemical bath may be completely drained if the Tencor AIT scan suggests that there is a failures in the formation of the surface particles. Tencor AIT Scanner is a common apparatus that scans the surface of a semiconductor wafer to detect the deposition of large particles thereon. Thus, the solution in the chemical bath also is completely drained, in the described embodiment of the inventive method, whenever the particle failure exceeds an upper control limit defined by production quality standards or specifications. For example, if more than 15 particles having a size that is greater than 0.16 microns are formed on a substrate surface, the solution may be completely drained.

In one embodiment of the inventive method, the nitride strip etch system 100 of FIG. 1 is examined to qualify its operational performance aster every twelve hours of operation. A typical "tool" or system 100 qualification step includes measuring the nitride etch rate, the thermal oxide etch rate, and the particle performance as is known by those skilled in the art. Accordingly, the above listed failures that cause the solution in the chemical bath 106 to be completely drained only "occur" whenever one of these system 100 qualification steps is done. As may be seen, for this described embodiment of the inventive method, the partial drain times may only be adjusted once per twelve hour period because there is no information regarding etch time in the interim to prompt a change in the partial drain time. The inventive method generally includes, however, modifying the partial drain whenever any tool performance data suggests that a change is warranted.

Figure 4:
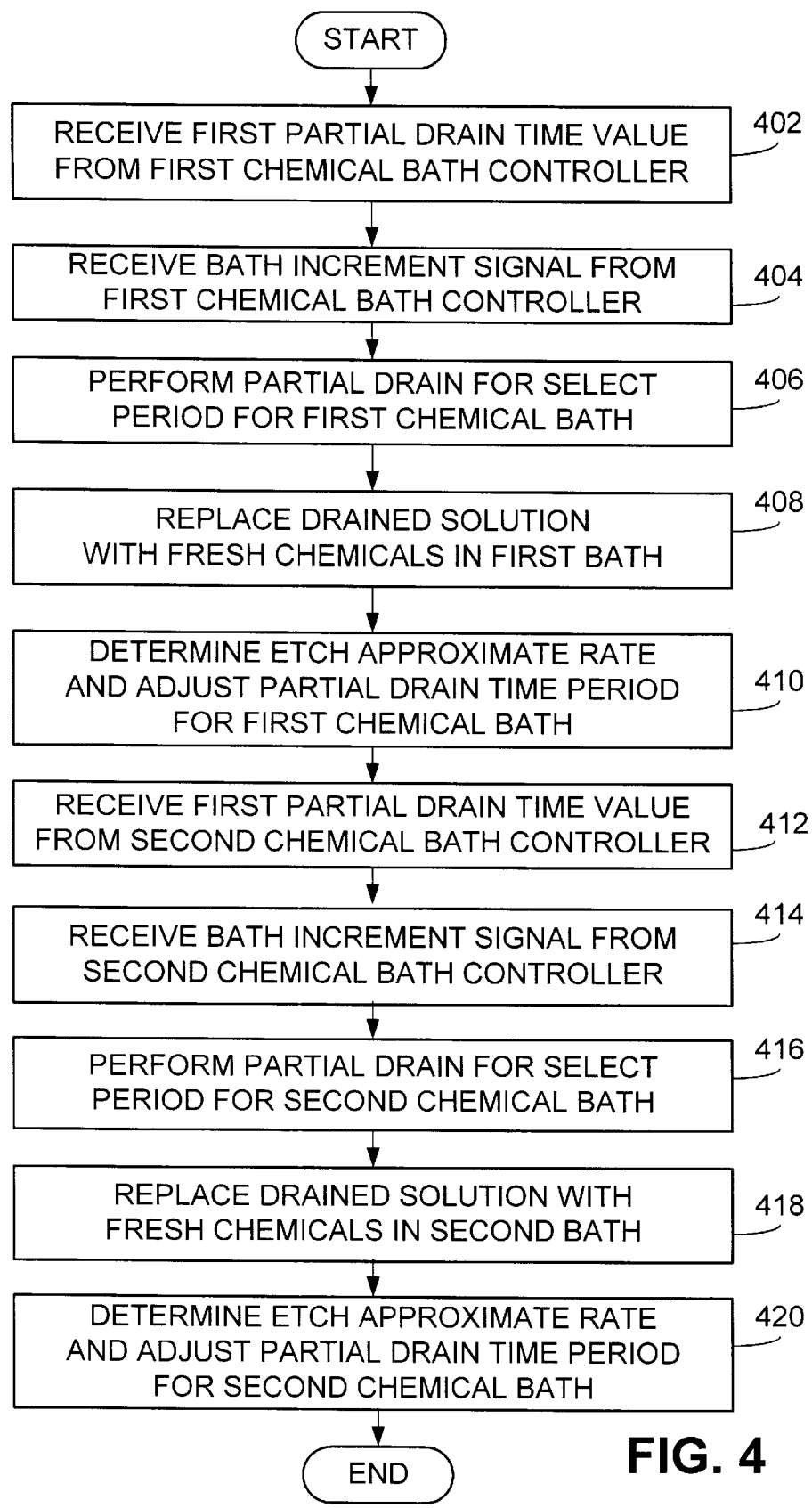
FIG. 4 is a logic flow diagram that illustrates a method for etching a wafer lot to perform a nitride strip therefor according to a preferred embodiment of the inventive method.

FIG. 4 is a logic flow diagram that illustrates a method for etching a wafer lot to perform a nitride strip according to a preferred embodiment of the inventive method. Referring now to FIG. 4, a first valve controller receives a first partial drain time value from a first chemical bath controller (step 402). Some time after a wafer lot is placed within the bath and removed, the method includes receiving a bath increment signal 122 from a bath controller 120 (step 404). After the bath increment signal 122 is received, the first valve controller causes a first chemical bath to drain its chemical bath solution for the specified first partial drain time value (step 406). Thereafter, the drained solution is replaced with fresh solution (step 408). External to the valve controller, the method further includes adjusting the drain time value according to a measured etch rate (step 410).

Once the wafer lot has been dipped in the first bath as described above, it is dipped in a second bath to remove additional amounts of oxide and nitride. The steps include a second valve controller receiving a second partial drain time value from a second bath controller 120 (step 412). Some time after the wafer lot is placed within the second bath and removed, the method includes receiving, by the second bath controller 120, a bath increment signal 122 from the second bath controller 120 (step 414).

After the bath increment signal 122 is received, the second valve controller causes a second chemical bath to drain its chemical bath solution for the specified second partial drain time value (step 416). Afterwards, the drained solution is replaced with fresh solution (step 418). External to the valve controller 102, the method further includes adjusting the drain time value according to a measured etch rate of the second bath (step 420).

Figure 5:
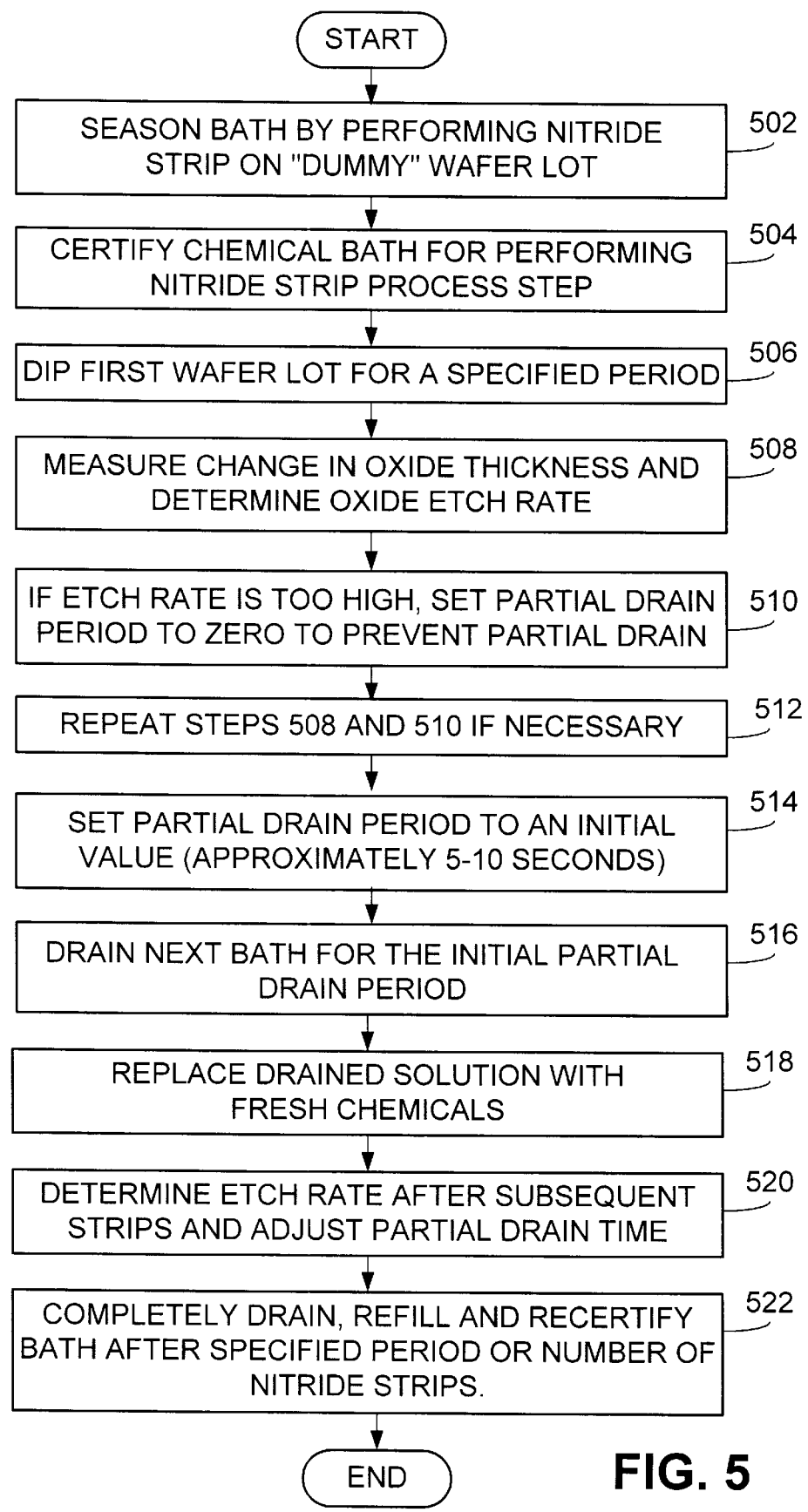
FIG. 5 is a logic flow diagram that illustrates a method for etching a wafer lot to perform a nitride strip therefor according to an alternate embodiment of the inventive method.

FIG. 5 is a logic flow diagram that illustrates a method for etching a wafer lot to perform a nitride strip therefor according to an alternate embodiment of the inventive method. Referring now to FIG. 5, a chemical bath 106 is initially seasoned with dummy wafers to increase the silicon content of the bath solution (step 502). Afterwards, the bath is certified for doing nitride strips (step 504) A first wafer lot is then dipped in the bath for a specified period to have its nitride stripped (step 506).

After the first wafer lot is processed, an approximate oxide etch rate is determined (step 508). The approximate etch rate may be determined either by chemical analysis of the bath solution or, preferably, by measuring the actual thickness of the field oxide after a nitride strip process step. If the amount of approximate oxide etch rate exceeds a first specified number (ie., the oxide etch rate exceeds a specified rate), the partial drain time is set to zero to prevent it from partially draining the chemical bath 106 (step 510). Steps 508 and 510 are then repeated until the oxide etch rate drops below the specified etch rate (step S12).

To clarify, one embodiment includes measuring the actual field oxide thickness to determine the amount of etching and the corresponding etch rate. In other embodiments, however, the chemical content of the solution is analyzed to determine an approximate concentration of silicon. Since there exists an inverse relationship between silicon content and oxide etch rate, the approximate etch rate is determined and modified merely by analyzing silicon content within the solution. According to the system implementation, the etch rates may be approximately calculated through other similar determinations and are included herein for all purposes.

Once the etch rate has dropped below the specified etch rate for the most recent wafer lot, the partial drain time is set to an initial partial drain time (step 514). Afterwards, the chemical bath 106 is drained for the initial partial drain time (step 516) and is replenished with fresh solution (step 518). After each subsequent nitride strip of wafer lots, the etch rate is calculated or measured and the partial drain time is adjusted (step 520) in one embodiment. In another embodiment of the invention, the approximate etch rate is calculated and the partial drain time is adjusted (if necessary) only after a specified number of nitride strips are done. For example, after 10 wafer lots are stripped of nitride. After one of a specified period of time or specified number of nitride strips, the bath is completely drained and replenished with fresh solution (step 522). For example, the bath is completely drained after 1300 wafers or after 10 days.

While the invention is susceptible to various modifications and alternative forms, specific embodiments thereof have been shown by way of example in the drawings and detailed description. It should be understood, however, that the drawings and detailed description thereto are not intended to limit the invention to the particular form disclosed, but on the contrary, the invention is to cover all modifications, equivalents and alternatives falling within the spirit and scope of the present invention as defined by the claims.

We claim:

1. A method by a valve controller coupled to drain a solution within a chemical bath for performing nitride strips of nitride on a plurality of wafers, the method comprising:

initially filling the bath with fresh solution such that the bath contains a full volume; and performing a two-step drain and replacement, comprising:

partially draining diluted solution in the chemical bath so that the bath contains a partial volume;

refilling the bath with a new volume of fresh solution after a nitride strip, wherein the new volume plus the partial volume substantially equal the full volume; and completely draining all of the solution in a chemical bath after one of a specified period of time has elapsed since the last complete drain, a specified number of strips has occurred since the last complete drain, or upon the detection of a process failure and filling the bath with a fill volume of fresh solution.

2. The method of claim 1 further including the step of partially draining the solution for a period of time specified by an operator.

3. The method of claim 2 further including the step of receiving a signal generated by external circuitry that is electrically coupled to the valve controller, the signal for specifying the drain time period specified by the operator.

4. The method of claim 1 wherein the specified period of time is equal to ten days.

5. The method of claim 1 wherein a complete drain also is performed upon the occurrence of a specified condition.

6. The method of claim 5 wherein the specified condition includes a measured nitride etch rate falling below a specified level.

7. The method of claim 5 wherein the specified condition includes a particle failure exceeded a specified control limit.

8. The method of claim 5 wherein the specified condition includes a measured oxide etch rate falling below a specified level.

9. The method of claim 8 wherein the specified condition includes the measured oxide etch rate falling below the specified level for three consecutive wafer lots.

10. A method for performing a nitride strip for a plurality of semiconductor wafers, comprising:

dipping the plurality of semiconductor wafers into a first chemical bath, the first chemical bath including phosphoric acid;

keeping the plurality of semiconductor wafers in the first chemical bath including a full volume of solution for a specified period of time;

removing the plurality of semiconductor wafers from the first chemical bath;

after removing the plurality of semiconductor wafers, partially draining the solution in the first chemical bath so that a partial volume of solution remains in the first bath;

refilling the first chemical bath with fresh solution to replace the drained solution wherein the new volume and partial volume in the first bath substantially equal the full volume of the first bath;

dipping the plurality of semiconductor wafers into a second chemical bath;

after removing the plurality of semiconductor wafers, partially draining the solution in the second chemical bath so that a partial volume of solution remains in the second bath; and refilling the second chemical bath with fresh solution to replace the drained solution wherein the new volume and partial volume in the second bath substantially equal the full volume of the second bath; completely draining the first chemical bath upon the occurrence of a specified condition and completely draining the second chemical bath upon the occurrence of a specified condition.

11. The method of claim 10 wherein the first chemical bath is drained for a first period of time.

12. The method of claim 11 wherein the second chemical bath is drained for a second period of time.

13. The method of claim 12 wherein the second period of time is approximately equal to two-thirds of the first period of time.

14. The method of claim 13 wherein the first period of time is greater than five seconds.

15. The method of claim 10 wherein the first chemical bath is completely drained whenever a specified fault condition is detected.

16. The method of claim 10 wherein a complete drain is performed whenever ten or more days has elapsed since the last complete drain.

17. The method of claim 10 wherein a complete drain is performed whenever a measured nitride etch rate falls below a specified threshold.

18. The method of claim 10 wherein a complete drain is performed whenever a measured oxide etch rate falls below a specified threshold.

* * * * *